US012713644B2

(12) United States Patent
Mota Frutuoso et al.

(10) Patent No.: US 12,713,644 B2
(45) Date of Patent: Aug. 18, 2026

(54) MOS TRANSISTOR ON SOI STRUCTURE

(71) Applicants: STMicroelectronics International N.V., Geneva (CH); STMicroelectronics (Crolles 2) SAS, Crolles (FR)

(72) Inventors: Tadeu Mota Frutuoso, Grenoble (FR); Xavier Garros, Grenoble (FR); Blandine Duriez, Grenoble (FR); Sebastien Cremer, Sassenage (FR)

(73) Assignees: STMicroelectronics International N.V., Geneva (CH); STMicroelectronics (Crolles 2) SAS, Crolles (FR)

( * ) Notice: Subject to any disclaimer, the term of this patent is extended or adjusted under 35 U.S.C. 154(b) by 465 days.

(21) Appl. No.: 18/190,897

(22) Filed: Mar. 27, 2023

(65) Prior Publication Data

US 2024/0096898 A1 Mar. 21, 2024

(30) Foreign Application Priority Data

Sep. 20, 2022 (FR) ....................................... 2209481
Sep. 20, 2022 (FR) ....................................... 2209483

(51) Int. Cl.
*H10D 30/63* (2025.01)
*H10D 86/00* (2025.01)
(Continued)

(52) U.S. Cl.
CPC ........... *H10D 30/637* (2025.01); *H10D 86/01* (2025.01); *H10D 86/201* (2025.01); *H10D 87/00* (2025.01);
(Continued)

(58) Field of Classification Search
CPC .... H10D 30/637; H10D 87/00; H10D 86/201; H01L 21/26513; H01L 21/266
See application file for complete search history.

(56) References Cited

U.S. PATENT DOCUMENTS 5,973,364 A 10/1999 Kawanaka
6,320,225 B1 * 11/2001 Hargrove .......... H01L 21/76897 257/773
(Continued)

FOREIGN PATENT DOCUMENTS

CN 108231899 A 6/2018
EP 0989613 A1 3/2000
(Continued)

*Primary Examiner* — Richard A Booth
(74) *Attorney, Agent, or Firm* — Seed Intellectual Property Law Group LLP

(57) ABSTRACT

The present description concerns an electronic device comprising: a silicon layer, an insulating layer in contact with a first surface of the silicon layer, a transistor comprising source, drain, and body regions arranged in the silicon layer, and a gate region topping the body region and comprising a gate portion laterally extending beyond the source and drain regions, the body region being continued by a body contact region not covered with the gate region, and a region of extension of the body region being located under the gate portion; the device further comprising, under the gate portion, a partial insulating trench in the silicon layer extending from a second surface of the silicon layer down to a depth smaller than the thickness of the silicon layer.

18 Claims, 3 Drawing Sheets

(51) Int. Cl.
*H10D 86/01* (2026.01)
*H10D 87/00* (2026.01)
*H10P 30/20* (2026.01)
*H10P 30/22* (2026.01)

(52) U.S. Cl.
CPC ............ *H10P 30/204* (2026.01); *H10P 30/21* (2026.01); *H10P 30/22* (2026.01)

(56) References Cited

U.S. PATENT DOCUMENTS

| | | | | |
|---|---|---|---|---|
| 6,670,675 | B2 * | 12/2003 | Ho | H10D 30/6708 257/349 |
| 2003/0111693 | A1 | 6/2003 | Unnikrishnan | |
| 2005/0173764 | A1 * | 8/2005 | Fechner | H10D 30/6711 438/517 |
| 2009/0047757 | A1 | 2/2009 | Tsujiuchi et al. | |
| 2011/0079851 | A1 | 4/2011 | Li et al. | |
| 2014/0332887 | A1 | 11/2014 | Zhang et al. | |
| 2023/0018629 | A1 | 1/2023 | Liu | |
| 2024/0097030 | A1 | 3/2024 | Cremer et al. | |

FOREIGN PATENT DOCUMENTS

| | | | |
|---|---|---|---|
| JP | 2002231956 | A | 8/2002 |
| WO | WO 0225701 | A2 | 3/2002 |

* cited by examiner

MOS TRANSISTOR ON SOI STRUCTURE

CROSS-REFERENCE TO RELATED APPLICATION(S)

This application claims the priority benefit of French patent application number FR2209483, filed on Sep. 20, 2022, entitled "Transistor MOS sur structure SOI," which is hereby incorporated by reference to the maximum extent allowable by law.

TECHNICAL FIELD

The present disclosure generally concerns electronic devices, and more particularly electronic devices comprising a MOS ("Metal Oxide Semiconductor") transistor. It more particularly aims at a MOS transistor formed inside and on top of an SOI ("Silicon On insulator") structure, for example, a PDSOI ("Partially Depleted Silicon On insulator") structure.

DESCRIPTION OF THE RELATED ART

There exist different types of substrate structures inside and on top of which transistors can be formed, for example, bulk substrate structures or SOI structures. MOS transistors on an SOI structure have various advantages, among which a high integration density and a high electric performance.

It would be desirable to at least partly overcome certain disadvantages of known embodiments of MOS transistors on an SOI structure.

BRIEF SUMMARY

There is a need to improve the performance of MOS transistors on an SOI structure, and particularly of PDSOI-type transistors.

An embodiment overcomes all or part of the disadvantages of known MOS transistors.

An embodiment provides an electronic device comprising:

- a silicon layer having a first surface and a second surface,
- an insulating layer in contact with the first surface of the silicon layer,
- at least one transistor comprising source, drain, and body regions arranged in the silicon layer, and a gate region topping the body region and comprising a gate portion laterally extending beyond the source and drain regions, the body region being continued by a body contact region not covered with the gate region, and a region of extension of the body region being located under the gate portion;
- the device further comprising, under the gate portion, a partial insulating trench in the silicon layer extending from the second surface of said silicon layer down to a depth smaller than the thickness of said silicon layer.

According to an embodiment, the body contact region is laterally positioned next to the gate portion.

According to an embodiment:

- the body region comprises a channel region between the source region and the drain region; and
- the gate region comprises a first portion topping the channel region, the gate portion being a second portion of the gate region continuing said first portion laterally beyond said channel region.

According to an embodiment, the partial insulating trench has a width greater than or equal to the width of the gate portion.

According to an embodiment, the ratio of the depth of the insulating trench to the thickness of the silicon layer is in the range from approximately 0.2 to 0.8.

According to an embodiment, the gate portion is coupled to at least one gate contact pad, for example, via a first silicide layer.

According to an embodiment, the body contact region is coupled to at least one body contact pad, for example via a second silicide layer.

According to an embodiment, the body contact region, the source region, and the drain region are flush with the second surface of the silicon layer.

According to an embodiment, the body contact region is separate from the partial insulating trench.

According to an embodiment, the device comprises a first peripheral insulating trench, the body contact region being laterally positioned between said first peripheral insulating trench and the partial insulating trench.

According to an embodiment, the device comprises a second peripheral insulating trench, the source and drain regions being laterally positioned between said second peripheral insulating trench and the partial insulating trench.

According to an embodiment, the at least one transistor is a transistor on a structure of silicon-on-insulator type comprising the silicon layer, the insulating layer, and a substrate topped with said insulating layer, the structure being for example a structure of partially depleted silicon on insulator type.

According to an embodiment, the gate portion is less heavily doped than the rest of the gate region, for example, the gate portion is non-intentionally doped.

According to an embodiment, the device comprises a gate insulator layer between the gate region and the silicon layer.

According to an embodiment, the gate insulator layer has, under the gate portion, a thickness greater than the thickness of the rest of the gate insulator layer.

An embodiment provides a method of manufacturing an electronic device comprising:

- a silicon layer having a first surface and a second surface,
- an insulating layer in contact with the first surface of the silicon layer,
- at least one transistor comprising source, drain, and body regions arranged in the silicon layer, and a gate region topping the body region and comprising a gate portion laterally extending beyond the source and drain regions, the body region being continued by a body contact region not covered with the gate region, and a region of extension of the body region being located under the gate portion;
- the method comprising, before the forming of gate region, the forming, under the location of the gate portion, of a partial insulating trench in the silicon layer from the second surface of said silicon layer down to a depth smaller than the thickness of said silicon layer.

BRIEF DESCRIPTION OF THE SEVERAL VIEWS OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Figure 1A:
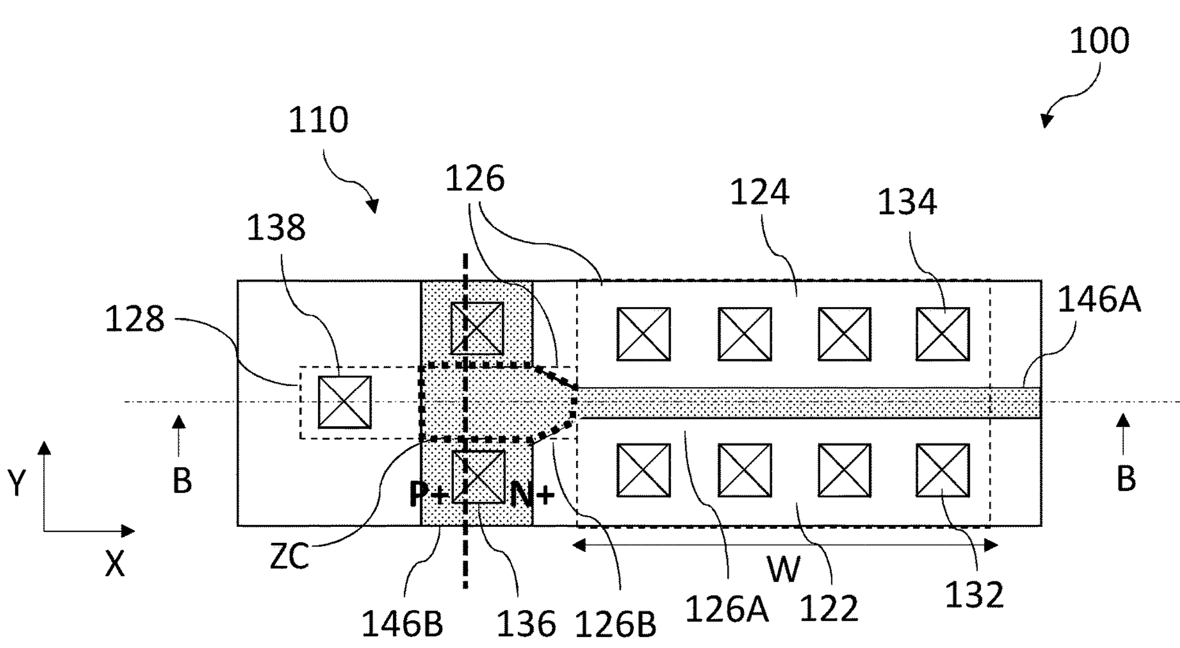
FIG. 1A shows, in a partial simplified top view, an example of an electronic device comprising a MOS transistor on an SOI structure.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the methods of manufacturing the described MOS transistors have not been detailed, being implementable with usual methods of microelectronics. Similarly, all the details of the MOS transistors have not been described. Further, the various possible applications of the described MOS transistors have not all been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred unless specific otherwise to the orientation of the drawings or to a MOS transistor in a normal position of use.

Unless specified otherwise, the expressions "around," "approximately," "substantially" and "in the order of" signify within 10%, and preferably within 5%.

In the following description, a width corresponds to a dimension in a first X direction indicated in the drawings, a thickness or a depth corresponds to a dimension in the vertical Z direction indicated in the drawings, and a length corresponds to a dimension in a second lateral Y direction, orthogonal to the X direction, corresponding to a direction parallel to the conduction direction of the transistor. Thus, there is called channel length of the transistor the dimension, along the Y direction, of a channel-forming region of the transistor, corresponding to the distance between a source region and a drain region of the transistor.

The described examples of transistors are N-channel MOS transistors (NMOS), that is, transistors having their source and drain regions N-type doped, for example doped with arsenic or phosphorus atoms, while the body region is P-type doped, for example, doped with boron atoms. The described embodiments are however not limited to this specific case and may also apply to P-channel MOS transistors (PMOS).

FIG. 1A shows, in a partial and simplified top view, an example of an electronic device 100 comprising a MOS transistor 110 on an SOI structure.

Figure 1B:
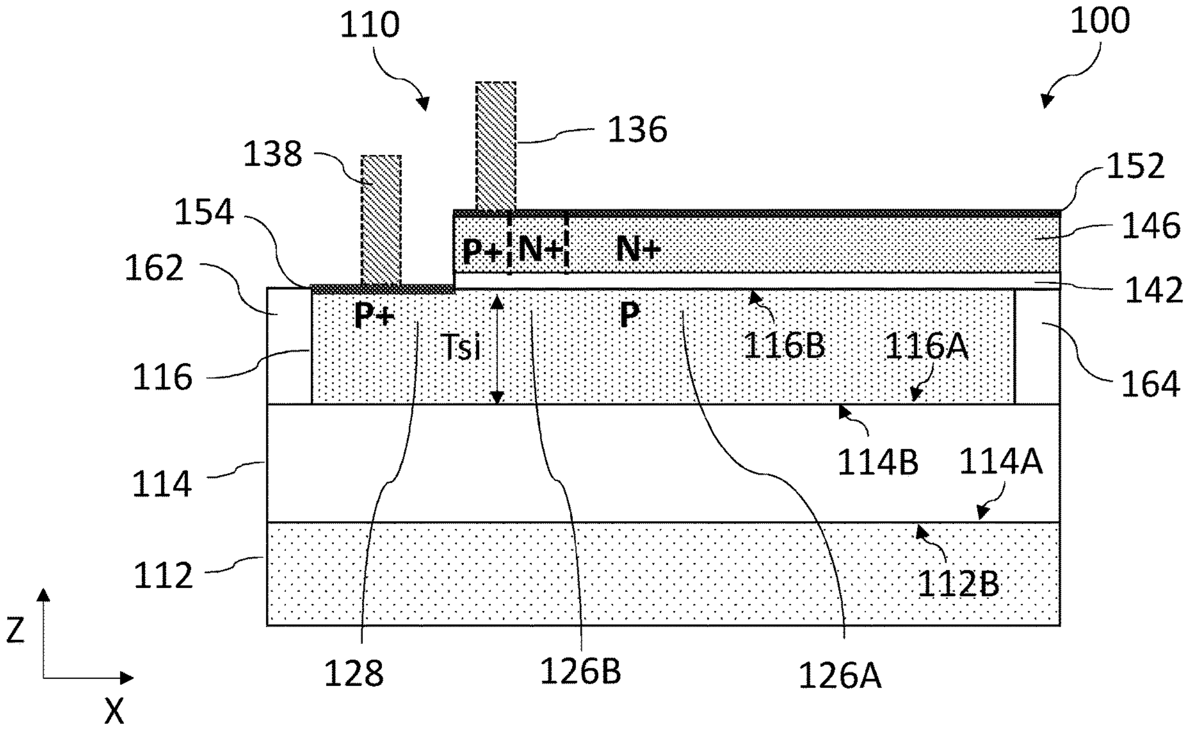
FIG. 1B shows a cross-section view of the device of FIG. 1A along the cross-section plane BB of FIG. 1A.

FIG. 1B shows a cross-section view of the device 1 of FIG. 1A along the cross-section plane BB of FIG. 1A.

Transistor 110 is formed inside and on top of an SOI structure comprising a substrate 112 made of a semiconductor material, for example, of silicon, topped with a buried insulating layer 114, for example, made of silicon dioxide ($SiO_2$), itself topped with a silicon layer 116, for example, made of single-crystal silicon. Silicon layer 116 and insulating layer 114 are for example much thinner than substrate 112, although this is not apparent in FIG. 1B.

As an example:

- substrate 112 has a thickness in the range from approximately 200 μm to 800 μm, for example from approximately 500 μm to 800 μm;
- buried insulating layer 114 has a thickness in the range from approximately 20 nm to 400 nm, for example from approximately 100 nm to 250 nm, or even from approximately 100 nm to 200 nm; and/or
- silicon layer 116 has a thickness Tsi in the range from 10 nm to 500 nm, for example from approximately 50 nm to 200 nm.

As an example, buried insulating layer 114 is formed on top of and in contact with semiconductor substrate 112 so that the lower surface 114A of buried insulating layer 114 is in contact with the upper surface 112B of semiconductor substrate 112. Silicon layer 116 is for example formed on top of and in contact with buried insulating layer 114 so that the lower surface 116A (first surface) of silicon layer 116 is in contact with the upper surface 114B of buried insulating layer 114.

Transistor 110 comprises a source region 122 and a drain region 124 formed in a region of silicon layer 116 called body region 126. In this shown example, body region 126 is P-type doped while source 122 and drain 124 regions are N-type doped.

An upper portion 126A of body region 126, between source region 122 and drain region 124, forms the channel-forming region of transistor 110, or channel region. Channel region 126A has a width W (in the first X lateral direction).

Preferably, the source 122, drain 124, and channel 126A regions are flush with the upper surface 116B (second surface) of silicon layer 116.

Source 122 and drain 124 regions extend widthwise along the cross-section plane BB of FIG. 1B (along lateral direction X).

Transistor 110 comprises one or a plurality of source contact pads 132 topping source region 122 and electrically coupled to source region 122, and one or a plurality of drain contact pads 134 topping drain region 124 and electrically coupled to drain region 124. In the shown example, source contact pads 132 are in contact, by their lower surfaces, with the upper surface of source region 122 and drain contact pads 134 are in contact, by their lower surfaces, with the upper surface of drain region 124. Source 132 and drain 134 contact pads allow the electric contact respectively between the source 122 and drain 124 regions of transistor 110 and other components via an interconnection network not shown in FIGS. 1A and 1B. In FIG. 1A, four source contact pads 132 and four drain contact pads 134 have been shown. In practice, the number of contact pads of each type may be different from four. Contact pads 132, 134 are for example made of a metallic material, for example, of tungsten.

Preferably, source region 122 and drain region 124 are more heavily doped, N+ in this example, locally in contact with contact pads 132 and 134 to optimize the electric contact between regions 122 and 124 and, respectively, contact pads 132 and 134.

Preferably, a silicide layer (not shown) is formed under each contact pad 132, 134.

Transistor 110 further comprises a gate region 146 located above silicon layer 116. Gate region 146 is for example made of polysilicon. In this example, gate region 146 is N+-type doped. As an example, gate region 146 is doped at the same time as the source 122 and drain 124 regions of the transistor, and is used as a mask for protecting channel region 126A during the implantation of the N-type dopant elements.

Gate region 146 has for example a thickness in the range from approximately 30 nm to 200 nm, for example, equal to approximately 100 nm.

Gate region 146 is separated from silicon layer 116 by an insulating layer 142, called gate insulator layer, or gate insulator. As an example, the gate insulator is made of silicon dioxide ($SiO_2$) and has, for example, a thickness in the range from approximately 1 nm to 10 nm. The gate insulator may have a thickness in the range from approximately 1 to 4.5 nm, for example, approximately 2.1 nm, for a transistor called GO1 ("Gate Oxide 1"), that is, with a gate insulator of small thickness, or a thickness in the range from approximately 4.5 to 10 nm, for example, approximately 6.5 nm, for a transistor called GO2 ("Gate Oxide 2"), that is, with a gate insulator of large thickness.

Gate insulator 142 is for example in contact, by its lower surface, with the upper surface 116B of silicon layer 116 in channel-forming region 126A, and, by its upper surface, with the lower surface of gate region 146.

In the shown example, gate region 146 (as well as gate insulator 142) comprises:

- a first portion 146A which extends laterally above channel region 126A between source region 122 and drain region 124; and
- a second portion 146B which laterally continues first portion 146A beyond channel region 126A, source region 122, and drain region 124; this second portion 146B can be designated with the term gate portion, or gate head.

As a variant, gate region 146 may be continued by a second gate head (not shown) at the second end of first portion 146A.

Gate region 146 comprises, in contact with gate head 146B, one or a plurality of gate contact pads 136, also called gate contacts, adapted to electrically connecting gate region 146 to one or a plurality of other components via an interconnection network, not shown. In FIG. 1A, two gate contacts 136 have been shown. However, in practice, the number of gate contacts 136 may be different from two. As an example, gate contacts 136 are metallic, for example made of the same material as source and drain contact pads 132 and 134, for example, made of tungsten. In the shown example, gate contact pads 136 are in contact, by their lower surfaces, with the upper surface of gate head 146B.

Preferably, a first silicide layer 152 is formed in the upper surface of gate region 146 and each gate contact pad 136 is formed on said first silicide layer.

In the shown example, transistor 110 is laterally surrounded with insulating trenches 162, 164 (peripheral insulating trenches), for example, filled with silicon oxide, for example, of STI ("Shallow Trench Isolation") type. More particularly, in the shown example, a first insulating trench 162 is located on the side of a body contact region 128, which will be described in further detail hereafter, and a second insulating trench 164 is located on the side of source 122 and drain 124 regions. Each insulating trench 162, 164 extends vertically from the upper surface 116B of silicon layer 116, for example across the entire thickness of silicon layer 116 to reach buried insulating layer 114. In the shown example, each insulating trench 162, 164 emerges at the limit of silicon layer 116 with buried insulating layer 114. As a variant (not shown), each insulating trench may cross all or part of the thickness of buried insulating layer 116, or even all or part of the thickness of substrate 112.

The shown SOI structure is preferably a PDSOI structure, which generally requires for the silicon layer to have a sufficiently large thickness Tsi, typically greater than approximately 30 nm, so that said silicon layer is never fully depleted.

In a PDSOI transistor, the body region may be floating or may be electrically connected so as to be biased. In certain applications, for example, analog, in particular RF (Radio Frequencies), it may be advantageous to control the potential of the body region by electrically biasing it.

Among solutions to bias the body region, there exists the solution of forming a body contact on a portion of the body region off-centered with respect to the gate region, and to the source and drain regions.

In the shown example, body region 126 is adapted to being biased. For this purpose, body region 126 is laterally continued, beyond source 122 and drain 124 regions, by a body contact region 128 flush with the upper surface 116B of silicon layer 116 (and thus at the same level as the source and drain regions).

Body contact region 128 is not covered with gate region 146, to be able to be in contact with at least one contact pad, as described hereafter. In the shown example, body contact region 128 is laterally positioned next to gate head 146B, and opposite to channel region 126A. An intermediate body region 126B (extension region), covered by gate head 146B, is arranged between channel region 126A and body contact region 128.

Transistor 110 comprises, in contact with body contact region 128, one or a plurality of body contact pads 138, also called, as a shortcut, body contacts. In the example of FIGS. 1A and 1B, transistor 110 comprises a single body contact pad 138. However, in practice, the number of body contacts 138 may be greater than one. Body contact pad 138 is for example, on top of and in contact, mechanically and electrically, with body contact region 128. Contact pad 138 allows the electric contact between the body region 126 of transistor 110 and other components via an interconnection network, not shown in FIGS. 1A and 1B.

Body contact 138 is preferably made of a metallic material, for example identical to the material of contact pads 122, 124. Body contact 138 is for example made of tungsten.

Body contact region 128 is preferably more heavily doped (P+ in this example) locally in the vicinity of contact pad 138 to optimize the electric contact between body contact region 128 and contact pad 138. During the P+ doping of body contact region 128 and the N+ doping of gate region 146, there may form in gate head 146B a mixed doping, P+, on the side of body contact region 128, and N+, on the side of first portion 146A of gate region 146.

Preferably, a second silicide layer 154 is formed in silicon layer 118 and each body contact pad 138 is formed on said second silicon layer.

A limitation of the structure of FIGS. 1A and 1B lies in an increased parasitic capacitance linked to the provision of the body contact. In particular, the stacking of the extension of the body region, of the gate insulator, and of the gate head, forms a parasitic capacitance. This may decrease the transistor performance, for example, decrease its switching speed.

The inventors provide a MOS transistor enabling to address the previously-described improvement needs, and to overcome all or part of the disadvantages of the previously-described MOS transistors. In particular, the inventors provide a MOS transistor on an SOI structure having its body region comprising a contacting area, and having an improved performance, particularly having a decreased parasitic capacitance induced by the contacting area. The inventors provide in particular a PDSOI-type transistor, having an improved performance.

Embodiments of MOS transistors will be described hereafter. The described embodiments are non-limiting and various variants will occur to those skilled in the art based on the indications of the present disclosure.

Figure 2A:
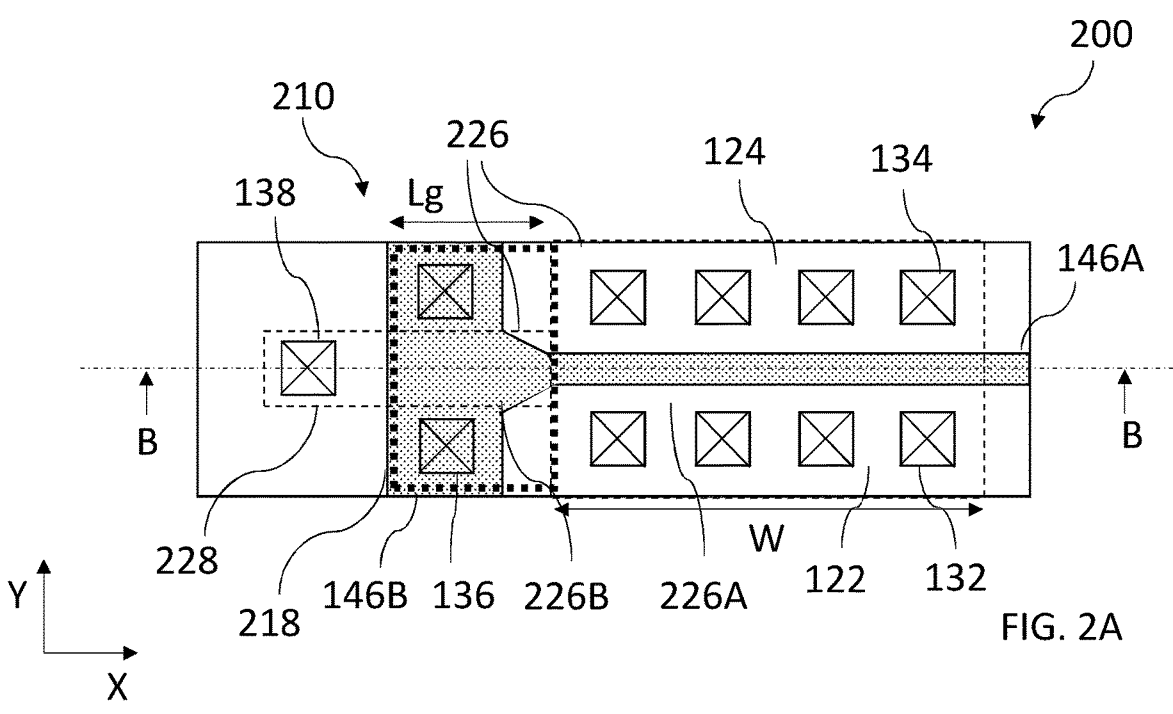
FIG. 2A shows, in a partial simplified top view, an example of an electronic device comprising a MOS transistor on an SOI structure according to an embodiment.

FIG. 2A shows, in a partial simplified top view, an example of a device 200 comprising a MOS transistor 210 on an SOI structure according to an embodiment.

Figure 2B:
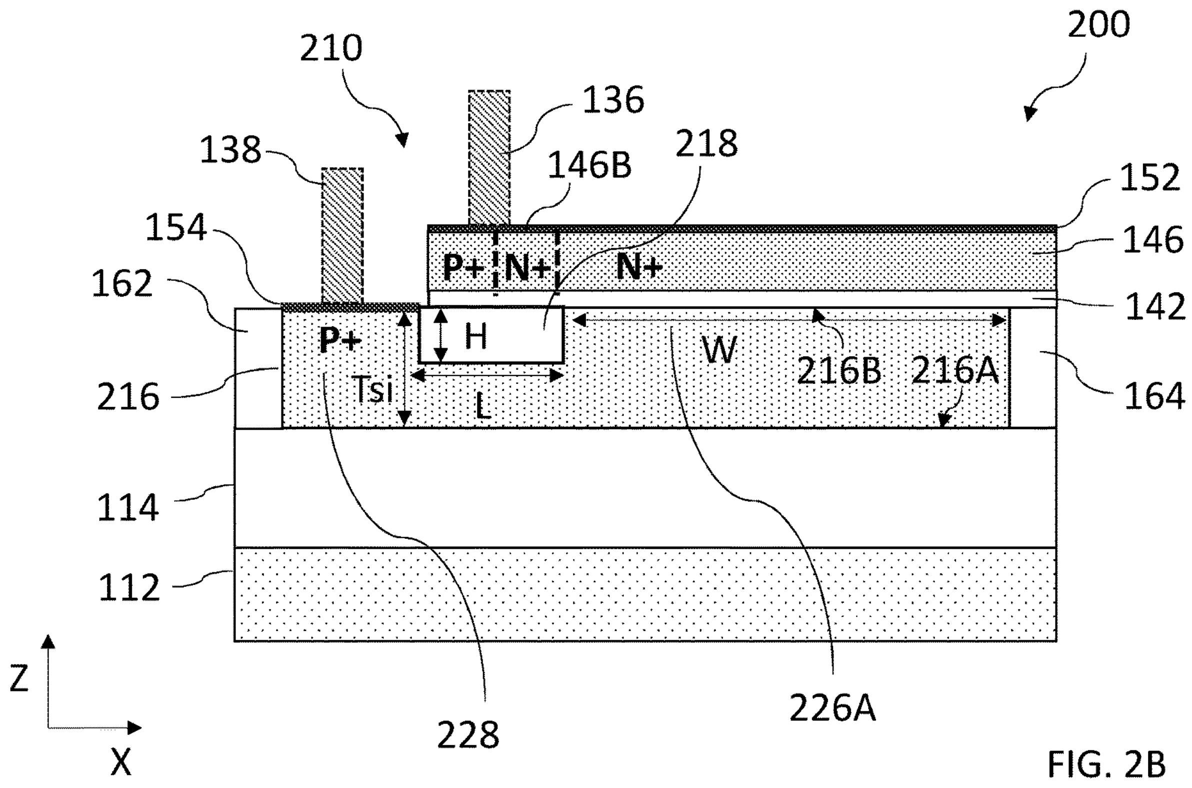
FIG. 2B shows a cross-section view of the device of FIG. 2A along the cross-section plane BB of FIG. 2A.

FIG. 2B shows a cross-section view of the device 200 of FIG. 2A along the cross-section plane BB of FIG. 2A.

The device 200 of FIGS. 2A and 2B comprises elements common with the device 100 of FIGS. 1A and 1B. For example, substrate 112, buried insulator layer 114, source 122, drain 124, gate 146 regions, gate insulator 142, the different contact pads 132, 134, 138, and insulating trenches 162, 164 are similar to the device 100 illustrated in FIGS. 1A and 1B. For simplification, these elements are not detailed again hereafter, and the elements common with the device 100 of FIGS. 1A and 1B are designated with the same reference numerals.

The device 200 of FIGS. 2A and 2B differs from the device 100 of FIGS. 1A and 1B essentially in that, in the embodiment of FIGS. 2A and 2B, a partial insulating trench 218 is formed form the upper surface 216B of silicon layer 216, down to a depth H of said silicon layer and under gate head 146B. The depth H of the insulating layer is smaller than the thickness Tsi of silicon layer 216. The insulating trench is made of a dielectric material, for example, $SiO_2$.

For example, the ratio of the depth H of insulating trench 218 to the thickness Tsi of silicon layer 216 is in the range from approximately 0.2 to 0.8, for example, equal to approximately 0.5.

As an example, the thickness Tsi of silicon layer 216 is equal to approximately 70 nm and the depth H of insulating trench 218 is in the range from approximately 14 to 56 nm, for example, equal to approximately 35 nm.

Preferably, the width L of insulating trench 218 is greater than or equal to the width Lg of gate head 146B.

Body contact region 228 is not covered with gate region 146, and it does not cover partial insulating trench 218.

In the shown example, body contact region 228 is positioned laterally next to gate head 146B, and thus next to partial insulating trench 218.

Partial insulating trench 218 enables to increase the insulator thickness between gate region 146 and body region 226, and thus to decrease the parasitic capacitance.

Further, it is possible to vary the depth of partial insulating trench 218 to decrease more or less the parasitic capacitance.

Similarly to the device 100 of FIGS. 1A and 1B, an upper portion 226A of body region 226, between source region 122 and drain region 124, forms the channel region of transistor 210. An intermediate body region 226B (extension region), covered with gate head 146B, may be comprised between body contact region 228 and channel region 226A.

Partial insulating trench 218 may be formed by usual insulating trench forming techniques. For example, a method of forming partial insulating trench 218 may comprise:

- the forming, by photolithography and etching, of a trench in silicon layer 216 down to a depth H of said silicon layer smaller than its thickness Tsi; and
- the filling of the trench with a dielectric material, for example, $SiO_2$.

Partial insulating trench 218 is formed before the deposition of gate insulator 142 and then of gate region 146, for example before or after the peripheral insulating trenches 162, 164 of the transistor.

Figure 3A:
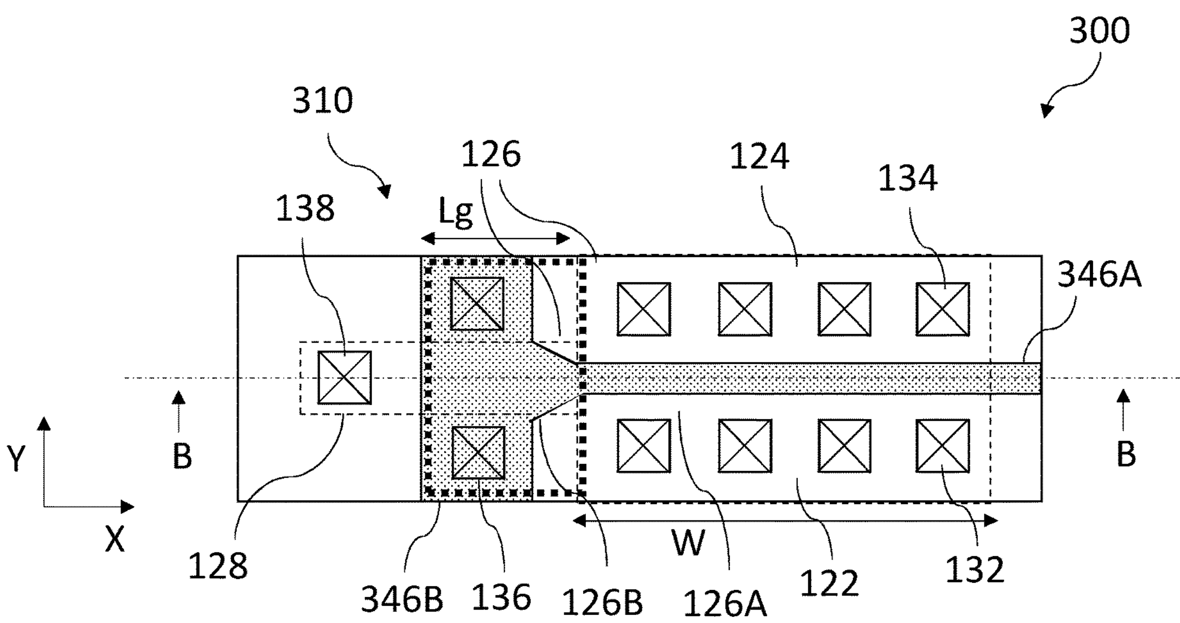
FIG. 3A shows, in a partial simplified top view, an example of an electronic device comprising a MOS transistor on an SOI structure according to another embodiment.

FIG. 3A shows, in a partial simplified top view, an example of a device 300 comprising a MOS transistor 310 on an SOI structure according to an embodiment.

Figure 3B:
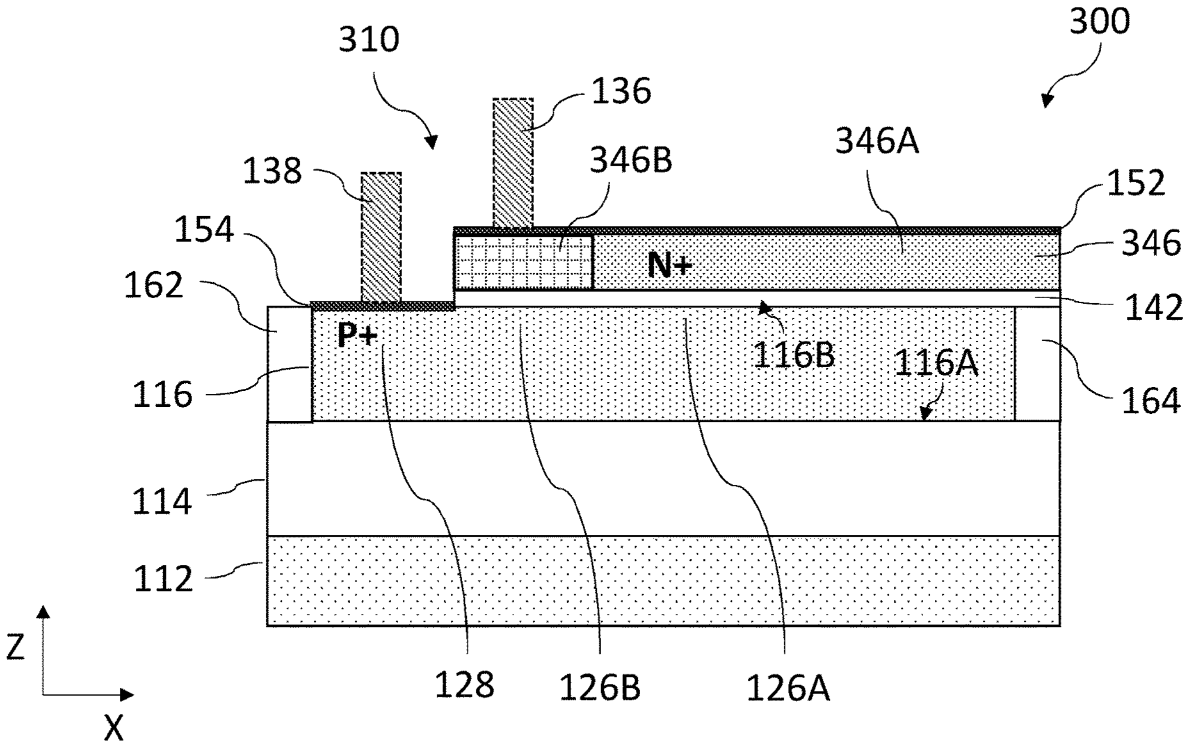
FIG. 3B shows a cross-section view of the device of FIG. 3A along the cross-section plane BB of FIG. 3A.

FIG. 3B shows a cross-section view of the device 300 of FIG. 3A along the cross-section plane BB of FIG. 3A.

The device 300 of FIGS. 3A and 3B comprises elements common with the device 100 of FIGS. 1A and 1B. For example, substrate 112, buried insulator layer 114, silicon layer 116, source 122, drain 124, and body 126 regions, gate insulator 142, the different contact pads 132, 134, 136, 138, and insulating trenches 162, 164 are similar to the device 100 illustrated in FIGS. 1A and 1B. For simplification, these elements are not detailed again hereafter, and the elements common with the device 100 of FIGS. 1A and 1B are designated with the same reference numerals.

The device 300 of FIGS. 3A and 3B differs from the device 100 of FIGS. 1A and 1B essentially in that, in the embodiment of FIGS. 3A and 3B, the second portion 346B (gate portion, or gate head) of gate region 346 is less heavily doped than the rest of the gate region, or even is not doped. Preferably, gate head 346B is made of intrinsic, that is, non-intentionally doped, polysilicon.

To form the gate region comprising a non-intentionally doped gate head, the positioning or the pattern of the masks used for the N+ implantation of the gate and for the P+ implantation of the body contact region is modified, so that gate head 346B remains masked during these two implantations.

The fact for gate head 346B to be non-intentionally doped enables to drastically decrease its electric conductivity, and thus the parasitic capacitance of the stack formed by body extension region 126B, gate insulator 142, and gate head 346B.

To be able to form a contact area on gate head 346B by means of one or a plurality of contact pads 136, the gate head is preferably covered with a first silicide layer 152.

The two embodiments respectively discussed in relation with FIGS. 2A, 2B and with FIGS. 3A, 3B may be combined together. In other words, a transistor structure comprising a non-intentionally doped gate head such as described in relation with FIGS. 3A, 3B and, under this gate head, a partial insulating trench such as described in relation with FIGS. 2A, 2B, may be provided.

Further, one and/or the other of the two disclosed embodiments may be combined with a local increase of the thickness of gate insulator 142 under gate 146B, 346B, as described for example in patent application CN108231899.

Various embodiments and variants have been described. Those skilled in the art will understand that certain features of these various embodiments and variants may be combined, and other variants will occur to those skilled in the art.

In particular, in the drawings, a single transistor has been shown. However, in practice, a device according to the embodiments may comprise a plurality of transistors, for example, identical or similar, integrated inside and on top of the SOI structure. Further, although embodiments are preferably described with a PDSOI structure, it is possible for the SOI structure not to be of PDSOI type.

Further, the described embodiments are not limited to the examples of dimensions and of materials mentioned in the present disclosure.

Finally, the practical implementation of the described embodiments and variations is within the abilities of those skilled in the art based on the functional indications given hereabove.

Electronic device (200) may be summarized as including a silicon layer (216) having a first surface (216A) and a second surface (216B), an insulating layer (114) in contact with the first surface (216A) of the silicon layer (216), at least one transistor (210) including source (122), drain (124), and body (226) regions arranged in the silicon layer (116), and a gate region (146) topping the body region (226) and including a gate portion (146B) laterally extending beyond the source and drain regions, the body region (226) being continued by a body contact region (228) not covered with the gate region (146), and a region (226B) of extension of the body region being located under the gate portion (146B); the device further including, under the gate portion (146B), a partial insulating trench (218) in the silicon layer (216) extending from the second face (216B) of said silicon layer down to a depth (H) smaller than the thickness (Tsi) of said silicon layer. The body contact region (228) may be laterally positioned next to the gate portion (146B).

The body region (226) may include a channel region (226A) between the source region (122) and the drain region (124); and the gate region (146) may include a first portion (146A) topping the channel region (226A), the gate portion (146B) being a second portion of the gate region continuing said first portion laterally above said channel region.

The partial insulating trench (218) may have a width (L) greater than or equal to the width (Lg) of the gate portion (146B). The ratio of the depth (H) of the insulating trench (218) to the thickness (Tsi) of the silicon layer (216) may be in the range from approximately 0.2 to 0.8. The gate portion (146B) may be coupled to at least one gate contact pad (136), for example, via a first silicide layer (152). The body contact region (228) may be coupled to at least one body contact pad (138), for example, via a second silicide layer (154). The body contact region (228), the source region (122), and the drain region (124) may be flush with the second surface (216B) of the silicon layer (216). The body contact region (228) may be separate from the partial insulating trench (218).

Device may include a first peripheral insulating trench (162), the body contact region (228) being laterally positioned between said first peripheral insulating trench and the partial insulating trench (218). Device may include a second peripheral insulating trench (164), the source (122) and drain (124) regions being laterally positioned between said second peripheral insulating trench and the partial insulating trench (218). The at least one transistor (210) may be a transistor on a structure of silicon-on-insulator type including the silicon layer (216), the insulating layer (114), and a substrate (112) topped with said insulating layer, the structure being for example a structure of partially depleted silicon on insulator type. The gate portion may be less heavily-doped than the rest of the gate region, for example the gate portion is non-intentionally doped.

Device may include a gate insulator layer (142) between the gate region (146) and the silicon layer (216). The gate insulator layer (142) may have, under the gate portion (146B), a thickness greater than the thickness of the rest of the gate insulator layer.

Method of manufacturing an electronic device (200) may be summarized as including a silicon layer (216) having a first surface (216A) and a second surface (216B), an insulating layer (114) in contact with the first surface (216A) of the silicon layer (216), at least one transistor (210) including source (122), drain (124), and body (226) regions arranged in the silicon layer (216), and a gate region (146) topping the body region (226) and including a gate portion (146B) laterally extending beyond the source and drain regions, the body region (226) being continued by a body contact region (228) not covered with the gate region (146), and a region of extension (226B) of the body region being located under the gate portion (146B); the method including, before the forming of the gate region (146), the forming, under the location of the gate portion (146B), of a partial insulating trench (218) in the silicon layer (216) from the second surface (216B) of said silicon layer down to a depth (H) smaller than the thickness (Tsi) of said silicon layer.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:

a silicon layer having a first surface and a second surface, an insulating layer in contact with the first surface of the silicon layer, at least one transistor comprising source, drain, and body regions arranged in the silicon layer, and a gate region topping the body region and comprising a gate portion laterally extending beyond the source and drain regions, the body region being continued by a body contact region not covered with the gate region, and a region of extension of the body region being located under the gate portion;

the device further comprising, under the gate portion, a partial insulating trench in the silicon layer extending from the second face of said silicon layer down to a depth smaller than the thickness of said silicon layer, wherein the gate portion is less heavily-doped than the rest of the gate region.

2. The device according to claim 1, wherein the body contact region is laterally positioned next to the gate portion.

3. The device according to claim 1, wherein:

the body region comprises a channel region between the source region and the drain region; and the gate region comprises a first portion topping the channel region, the gate portion being a second portion of the gate region continuing said first portion laterally above said channel region.

4. The device according to claim 1, wherein the partial insulating trench has a width greater than or equal to the width of the gate portion.

5. The device according to claim 1, wherein the ratio of the depth of the insulating trench to the thickness of the silicon layer is in the range from approximately 0.2 to 0.8.

6. The device according to claim 1, wherein the gate portion is coupled to at least one gate contact pad, for example, via a first silicide layer.

7. The device according to claim 1, wherein the body contact region is coupled to at least one body contact pad, for example, via a second silicide layer.

8. The device according to claim 1, wherein the body contact region, the source region, and the drain region are flush with the second surface of the silicon layer.

9. The device according to claim 1, wherein the body contact region is separate from the partial insulating trench.

10. The device according to claim 1, comprising a first peripheral insulating trench, the body contact region being laterally positioned between said first peripheral insulating trench and the partial insulating trench.

11. The device according to claim 1, comprising a second peripheral insulating trench, the source and drain regions being laterally positioned between said second peripheral insulating trench and the partial insulating trench.

12. The device according to claim 1, wherein the at least one transistor is a transistor on a structure of silicon-on-insulator type comprising the silicon layer, the insulating layer, and a substrate topped with said insulating layer, the structure being a structure of partially depleted silicon on insulator type.

13. The device according to claim 1, comprising a gate insulator layer between the gate region and the silicon layer.

14. The device according to claim 13, wherein the gate insulator layer has, under the gate portion, a thickness greater than the thickness of the rest of the gate insulator layer.

15. A device, comprising:

a substrate;

a silicon layer on the substrate;

a source region in the silicon layer;

a drain region in the silicon layer;

a body region in the silicon layer and including an extension region and a body contact region in the silicon layer, the body contact region having a first surface spaced from the substrate by a first distance;

a trench in the silicon layer adjacent to the body contact region;

a gate region on the silicon layer and on the trench, the gate region having a second surface spaced from the substrate by a second distance, the second distance being greater than the first distance, the gate region including a gate portion laterally extending beyond the source and drain regions, body contact region not being covered with the gate region, and a region of extension of the body region being located under the gate portion, wherein the trench is under the gate portion and extends from the second face of said silicon layer down to a depth smaller than the thickness of said silicon layer, wherein the gate portion is less heavily-doped than the rest of the gate region.

16. The device of claim 15, wherein the gate region includes a sidewall that faces the body contact region.

17. An electronic device, comprising:

a silicon layer including a first surface;

an insulating layer in contact with the first surface of the silicon layer;

a transistor, including:

a source region in the silicon layer;

a drain region in the silicon layer;

a body region in the silicon layer and including an extension region and a body contact region; and a gate region including a gate portion laterally extending beyond the source and drain regions, wherein the body contact region is not covered by the gate region, wherein the extension region of the body region is under the gate region;

a trench under the gate region in the silicon layer extending partially through the silicon layer, wherein the gate portion is less heavily-doped than the rest of the gate region.

18. The electronic device of claim 17, comprising a first contact coupled to the body contact region and a second contact coupled to the gate region.

* * * * *